US008610451B2

(12) United States Patent
Ahsan et al.

(10) Patent No.: US 8,610,451 B2
(45) Date of Patent: Dec. 17, 2013

(54) POST SILICIDE TESTING FOR REPLACEMENT HIGH-K METAL GATE TECHNOLOGIES

(75) Inventors: Ishtiaq Ahsan, Wallkill, NY (US);
David M. Fried, Brewster, NY (US);
Lidor Goren, Fishkill, NY (US);
Jiun-Hsin Liao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 12/946,875

(22) Filed: Nov. 16, 2010

(65) Prior Publication Data
US 2012/0119778 A1 May 17, 2012

(51) Int. Cl.
*G01R 31/26* (2006.01)
(52) U.S. Cl.
USPC .............. 324/762.09; 324/762.01; 257/48
(58) Field of Classification Search
None
See application file for complete search history.

(56) References Cited

U.S. PATENT DOCUMENTS

| 4,472,648 | A | 9/1984 | Prentice |
| 6,150,669 | A | 11/2000 | Nandakumar et al. |
| 6,381,718 | B1 | 4/2002 | Brown et al. |
| 6,400,425 | B1 | 6/2002 | Kim et al. |
| 6,615,391 | B2 | 9/2003 | Brown et al. |
| 6,989,551 | B2 | 1/2006 | Gunther et al. |
| 7,268,033 | B2 | 9/2007 | Anderson et al. |
| 7,439,538 | B2 * | 10/2008 | Shi et al. ............... 257/48 |
| 7,456,636 | B2 | 11/2008 | Patterson et al. |
| 7,592,827 | B1 * | 9/2009 | Brozek ............ 324/762.01 |

FOREIGN PATENT DOCUMENTS

JP 10206510 A2 8/1998

OTHER PUBLICATIONS

IBM, "Matrix Wiring for Measurement of Leaky FETs," Technical Disclosure, Prior Art Database, IPCOM000134150D, Feb. 24, 2006.
R.W. Mann et al., "Silicides and Local Interconnections for High-Performance VLSI Applications," IBM Journal of Research, vol. 39, No. 4, Jul. 1995.

* cited by examiner

*Primary Examiner* — Minh N Tang
(74) *Attorney, Agent, or Firm* — Cantor Colburn LLP; Ian MacKinnon

(57) ABSTRACT

A test structure for testing transistor gate structures in an IC device includes one or more probe pads formed at an active area of the IC device; one or more first conductive lines formed at the active area of the IC device, in electrical contact with the one or more probe pads; one or more second conductive lines formed at a gate conductor level of the IC device, in electrical contact with the one or more first conductive lines; and a gate electrode structure to be tested in electrical contact with the one or more second conductive lines; wherein the electrical contact between the one or more second conductive lines and the one or more first conductive lines is facilitated by a localized dielectric breakdown of a gate dielectric material disposed between the one or more second conductive lines and the one or more first conductive lines.

20 Claims, 6 Drawing Sheets

POST SILICIDE TESTING FOR REPLACEMENT HIGH-K METAL GATE TECHNOLOGIES

BACKGROUND

The present invention relates generally to semiconductor device manufacturing and, more particularly, to a structure and method for post silicide testing in replacement high-k metal gate (HKMG) technologies.

In standard complementary metal oxide semiconductor (CMOS) devices, polysilicon is typically used as the gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect, polysilicon gates commonly used in CMOS devices are becoming a gating factor in chip performance for channel lengths of 0.1 micron and below. Another problem with polysilicon gates is that the dopant material in the polysilicon gate (e.g., boron) can easily diffuse through the thin gate dielectric, causing further degradation of the device performance. Thus, one proposed way of improving the performance of sub-micron transistors is to use metal gates in place of conventional polysilicon gates, particularly with the advent of high-k gate dielectric materials.

In both traditional polysilicon gate structures and HKMG structures, post-silicide (PS) testing is used to test for faults such as, for example, opens and shorts within the gate conductor structure. Typically, a test device used for PS testing will include probe pads that are also formed from the gate electrode conductor material, and at the same device level as the gate structures (i.e., at the gate conductor or PC level). Although such test structures are suitable for PS testing in HKMG technology using a gate first integration scheme, they are not suitable for PS testing in HKMG technology using a gate last integration scheme. Since a gate last integration scheme initially entails forming a dummy gate structure (that is later removed to make way for the actual HKMG structure), only the active area (Rx) level shapes are exposed at the point of initial silicide formation. That is, the PC test probe pads are covered with an insulator material, thus rendering them unsuitable for electrical probing at this point in the manufacturing process.

SUMMARY

In one aspect, a test structure for testing transistor gate structures in an integrated circuit (IC) device includes one or more probe pads formed at an active area of the IC device; one or more first conductive lines formed at the active area of the IC device, in electrical contact with the one or more probe pads; one or more second conductive lines formed at a gate conductor level of the IC device, in electrical contact with the one or more first conductive lines; and a gate electrode structure to be tested, formed at the gate conductor level and in electrical contact with the one or more second conductive lines; wherein the electrical contact between the one or more second conductive lines and the one or more first conductive lines is facilitated by a localized dielectric breakdown of a gate dielectric material disposed between the one or more second conductive lines and the one or more first conductive lines.

In another aspect, a test structure for testing transistor gate structures in an integrated circuit (IC) device incorporating gate last, high-k metal gate fabrication technology includes one or more probe pads formed at an active area of the IC device; one or more first conductive lines formed at the active area of the IC device, in electrical contact with the one or more probe pads; one or more second conductive lines formed at a gate conductor level of the IC device, in electrical contact with the one or more first conductive lines; and a gate electrode structure to be tested, formed at the gate conductor level and in electrical contact with the one or more second conductive lines, the one or more second conductive lines and the gate electrode structure comprising a conductive metal material; the electrical contact between the one or more second conductive lines and the one or more first conductive lines being facilitated by a localized dielectric breakdown of a gate dielectric material disposed between the one or more second conductive lines and the one or more first conductive lines; a first of the one or more second conductive lines in contact with a first end of the gate electrode structure, and a second of the one or more second conductive lines is contact with a second end of the gate electrode structure; wherein each of the one or more second conductive lines includes a plurality of finger structures disposed at opposing ends thereof, the finger structures configured to facilitate dielectric breakdown of the gate dielectric material therebelow.

In another aspect, a method of forming a test structure for testing transistor gate structures in an integrated circuit (IC) device includes forming one or more probe pads at an active area of the IC device; forming one or more first conductive lines at the active area of the IC device, in electrical contact with the one or more probe pads; forming one or more second conductive lines at a gate conductor level of the IC device, in electrical contact with the one or more first conductive lines; forming a gate electrode structure to be tested, at the gate conductor level and in electrical contact with the one or more second conductive lines; and facilitating the electrical contact between the one or more second conductive lines and the one or more first conductive lines by locally breaking down a gate dielectric material disposed between the one or more second conductive lines and the one or more first conductive lines.

In another aspect, method of implementing post-silicide testing of transistor gate structures in an integrated circuit (IC) device includes applying a pair of test probes to exposed probe pads located at an active area of the IC device so as to complete a current path through a test structure and a gate electrode structure to be tested, with the test structure further comprising the exposed probe pads, one or more first conductive lines formed at the active area of the IC device, in electrical contact with the exposed probe pads; one or more second conductive lines formed at a gate conductor level of the IC device, in electrical contact with the one or more first conductive lines, and with the gate electrode structure to be tested; the one or more second conductive lines and the gate electrode structure to be tested being covered by an insulating material; and wherein the electrical contact between the one or more second conductive lines and the one or more first conductive lines is facilitated by a localized dielectric breakdown of a gate dielectric material disposed between the one or more second conductive lines and the one or more first conductive lines.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1:
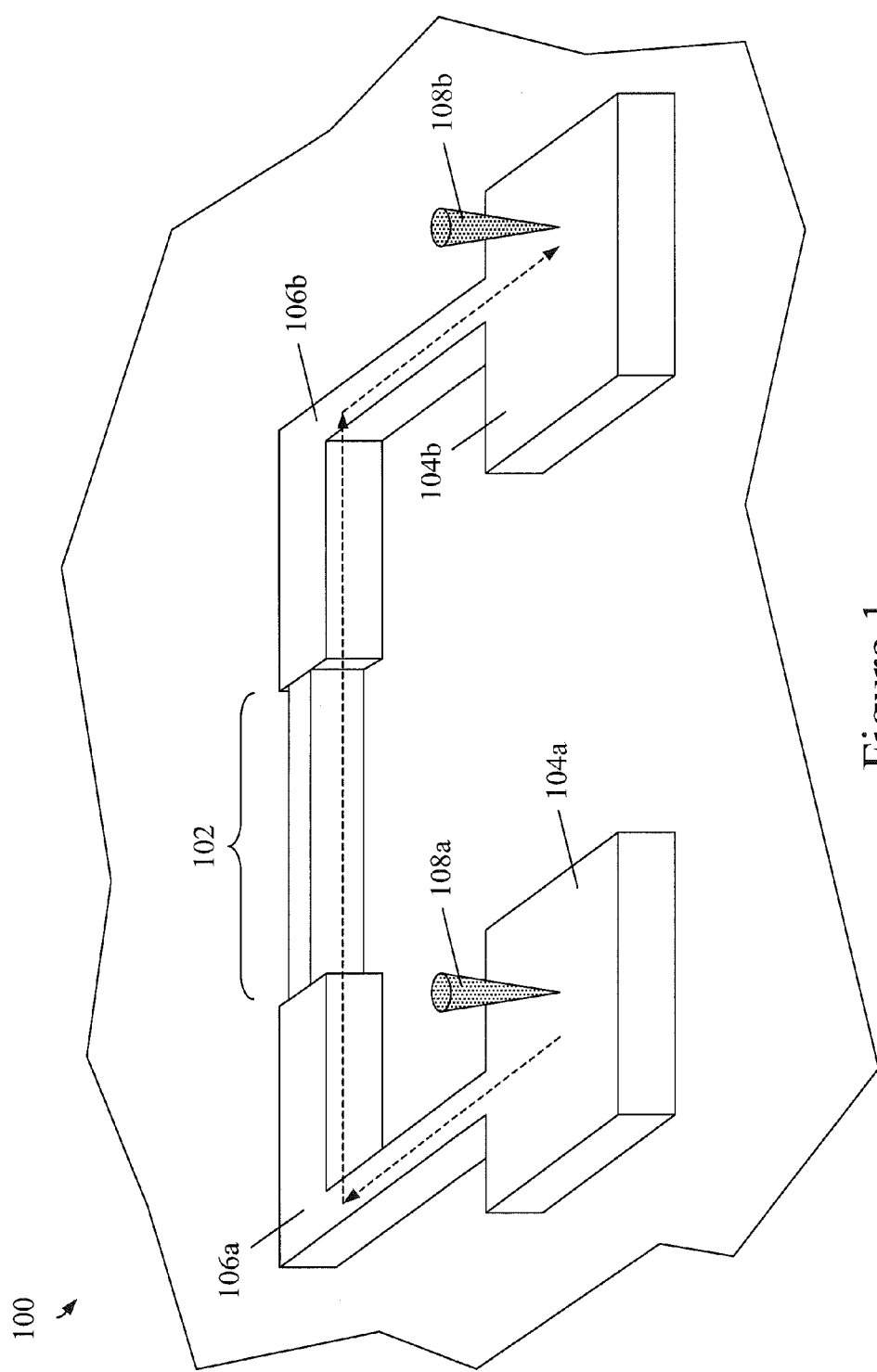
FIG. 1 is a perspective view of a conventional test structure for performing post-silicide testing of transistor gate structures.

Referring initially to FIG. 1, there is shown a perspective view of a conventional test structure 100 for performing post-silicide (PS) testing of transistor gate structures in integrated circuit (IC) devices. The test structure 100 is suitable for use in PS testing of polysilicon gate structures, as well as HKMG structures formed in accordance with a gate first process. As is shown, the test structure 100 is electrically coupled to opposite ends of a device under test (DUT) 102 by way of a pair of probe pads 104a, 104b, and conductive lines 106a, 106b. The probe pads 104a, 104b, and the conductive lines 106a, 106b are formed from the same gate electrode material as the DUT 102 (e.g., polysilicon, metal or a combination thereof). After silicide formation on source/drain regions (not shown) in the active areas and on the patterned gate electrode regions (including DUT 102, probe pads 104a, 104b, and conductive lines 106a, 106b) the test structure 100 may be utilized for PS testing.

As further shown in FIG. 1, the probe pads 104a, 104b, are contacted by a respective pair of probe pins 108a, 108b. Thus, an exemplary test current path through the test structure 100 (represented by the dotted arrows) begins at probe pad 104a, through conductive line 106a, through the DUT 102, through conductive line 106b, and finally to probe pad 104a. This allows for various types of PS testing of the DUT 102 including, for example, PC opens, PC shorts, sheet resistance, etc.

However, as indicated above, for a gate last (gate replacement) process flow in HKMG technology, the structures shown in FIG. 1 formed from the gate electrode material remain covered by insulating layers at the time PS testing occurs. Stated another way, only the active area (Rx) shapes such as silicided source/drain contacts are exposed. Thus, the test structure 100 is not suitable for PS testing where a gate last process is used.

Figure 2:
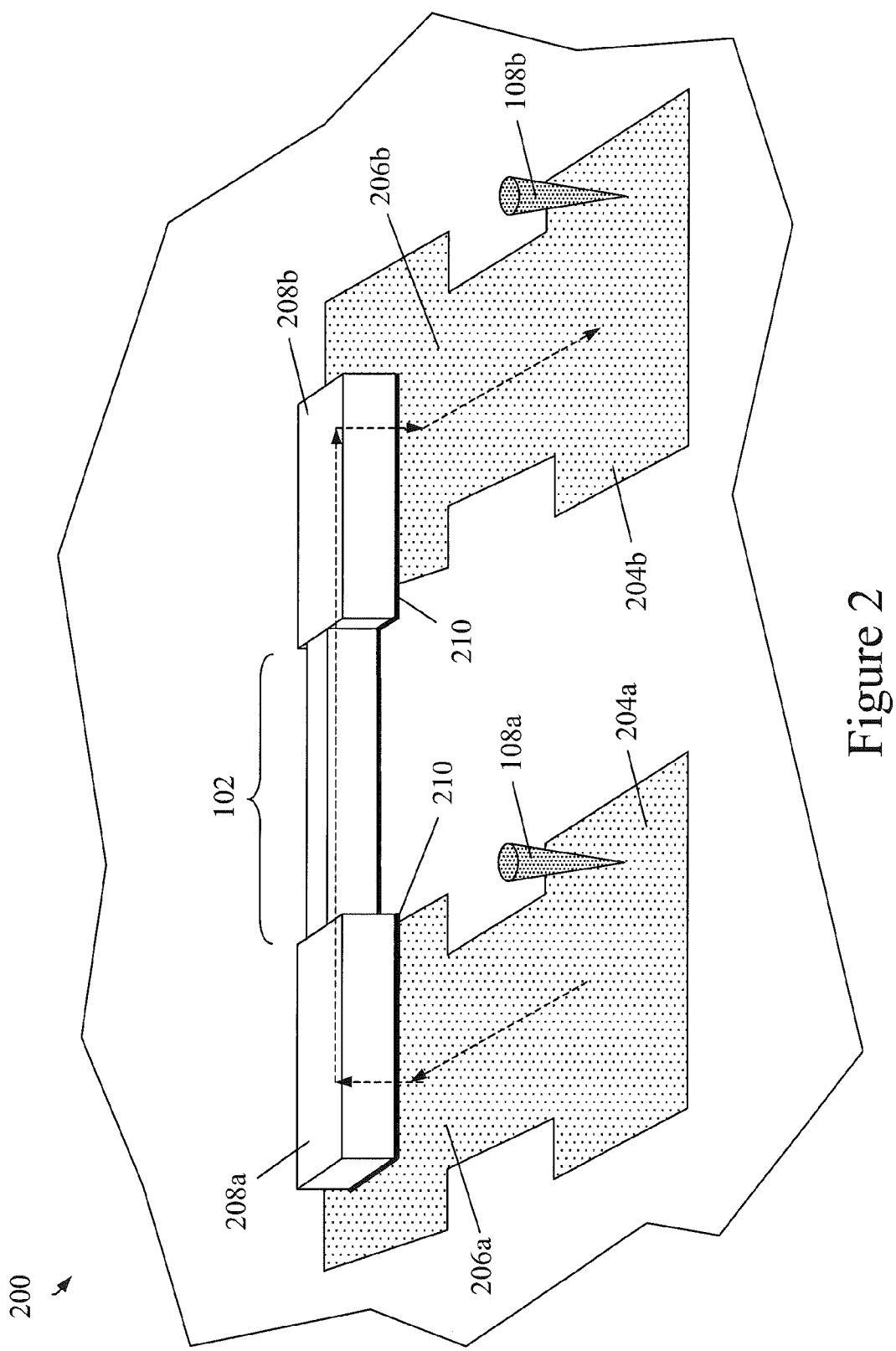
FIG. 2 is a perspective view of a test structure for performing post-silicide testing of transistor gate structures, in accordance with an embodiment of the invention.

Accordingly, FIG. 2 is a perspective view of a novel test structure 200 for post silicide testing of gate opens, shorts and resistance in gate last, HKMG technologies, in accordance with an embodiment of the invention. In contrast to the test structure 100 of FIG. 1 where the entire structure is formed at the PC level from the gate electrode material, the test structure 200 uses a combination of both active area (Rx) level and PC level structures.

More specifically, the test structure 200 of FIG. 2 includes a pair of probe pads 204a, 204b, and conductive lines 206a, 206b formed at the RX level of the device and, as such, are exposed post-silicication. The probe pads 204a, 204b, as well as the conductive lines 206a, 206b may include doped semiconductor regions (e.g., silicon) that have silicide metal contacts formed thereon. In addition, the test structure includes additional conductive lines 208a, 208b formed at the PC level of the device, and thus formed from the same gate electrode material as the DUT 102 (e.g., polysilicon, metal or a combination thereof). Exemplary metal materials that may be used in the gate electrode stack include, but are not limited to, aluminum (Al), tungsten (W), copper (Cu), platinum (Pt), silver (Ag), gold (Au), ruthenium (Ru), iridium (Ir), rhodium (Rh) and rhenium (Re), alloys of a conductive metal, e.g., AlCu, silicides of a conductive metal, e.g., W silicide, and Pt silicide, nitrides of a conductive metal, e.g., AlN, and combinations and multilayers thereof.

As is known in the art of semiconductor manufacturing, disposed between a patterned gate conductor and an active area is a thin layer of gate dielectric material 210, such as a gate oxide layer. Therefore, in order to facilitate good conduction between the RX and PC levels, as reflected by the current path (arrows) in FIG. 2, those localized portions of the gate dielectric material 210 between the RX level conductive lines 206a, 206b and the PC level conductive lines 208a, 208b are broken down or "blown" so as to be rendered leaky and sufficiently conductive.

Further, as will be illustrated below, this localized breakdown of the gate dielectric layer 210 is done in a manner so as not to damage the DUT 102. That is, the gate dielectric layer 210 of the DUT 102 is not damaged in this process. In so doing, the probe pins 108a, 108b may be respectively contacted to the RX level probe pads 204a, 204b for PS testing of the DUT 102 in a gate last HKMG fabrication scheme, even though the PC level structures remain covered with insulating material (not shown) at this point.

Figure 3:
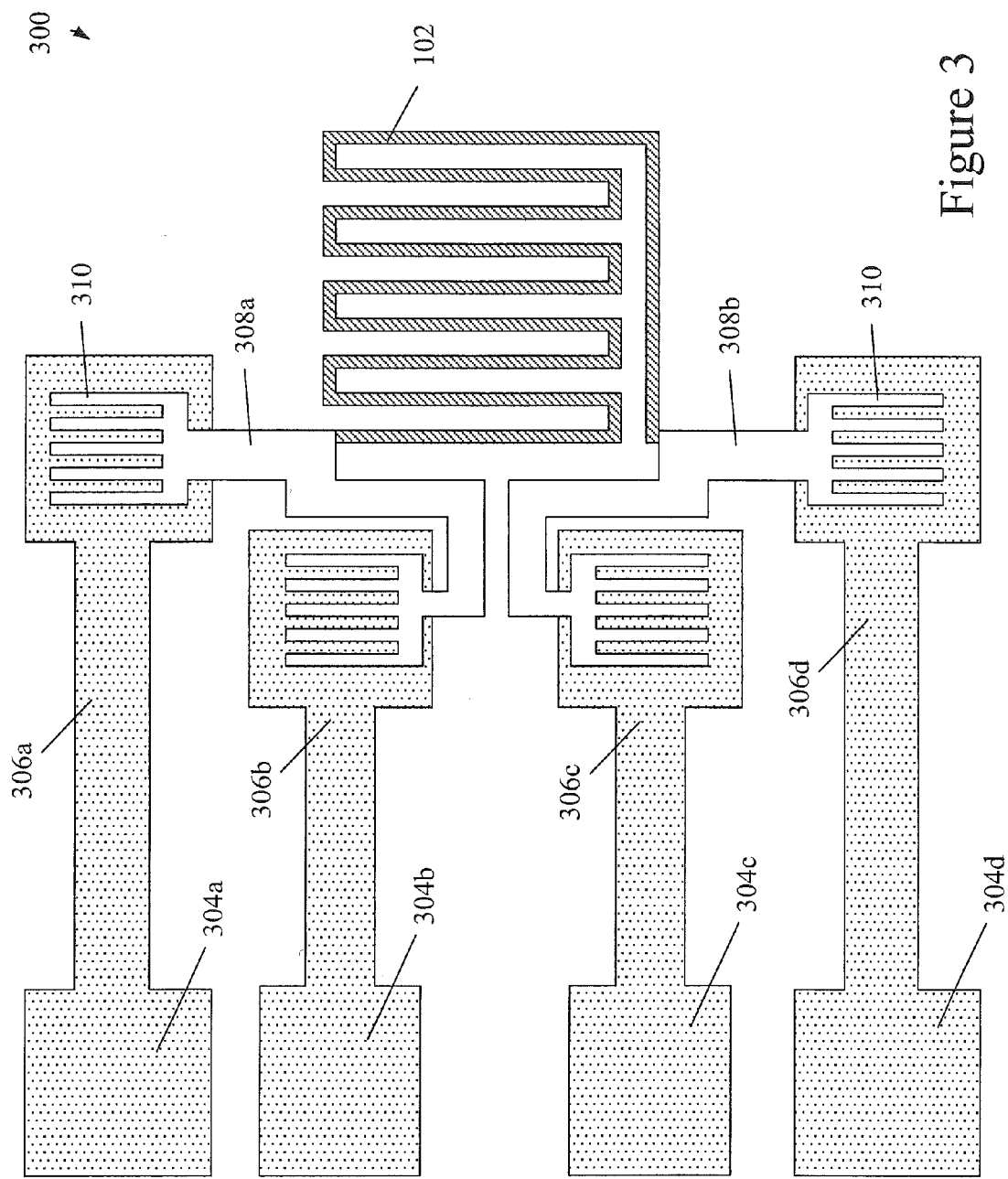
FIG. 3 is a top view of a more detailed test structure for performing post-silicide testing of transistor gate structures, in accordance with a further embodiment of the invention.

Referring now to FIG. 3, there is shown a top view of a more detailed test structure 300 for performing post-silicide testing of transistor gate structures, in accordance with a further embodiment of the invention. Conceptually, the test structure 300 is similar to the structure 200 of FIG. 2, in that the structure 300 includes probe pads 304a, 304b, 304c, 304d and conductive lines 306a, 306b, 306c, 306d formed at the RX level of the device, as well as conductive lines 308a, 308b formed at the PC level of the device. Here, the PC level conductive lines 308a, 308b contact opposite ends of the DUT 102. It is noted the DUT 102 of FIG. 3 is shown shaded for purposes of clarity, even though the DUT 102 is formed from the same gate electrode material as the PC level conductive lines 308a, 308b.

Each PC level conductive line 308a, 308b is connected to a pair of RX level conductive lines, and hence to a pair of RX level probe pads. That is, conductive line 308a is connected to conductive line 306a and probe pad 304a at a first end thereof, and to conductive line 306b and probe pad 304b at a second end thereof. Similarly, conductive line 308b is connected to conductive line 306c and probe pad 304c at a first end thereof, and to conductive line 306d and probe pad 304d at a second end thereof. The opposing ends of PC level conductive lines 308a and 308b terminate in a plurality of relatively thin finger structures 310 to facilitate the breakdown of the gate dielectric material therebeneath. In addition, the main portions of the conductive lines 308a and 308b between the end fingers are relatively wide with respect to the pattern of the DUT 102 so as to reduce the resistance thereof and increase the amount of test current passed therethrough.

Figure 4:
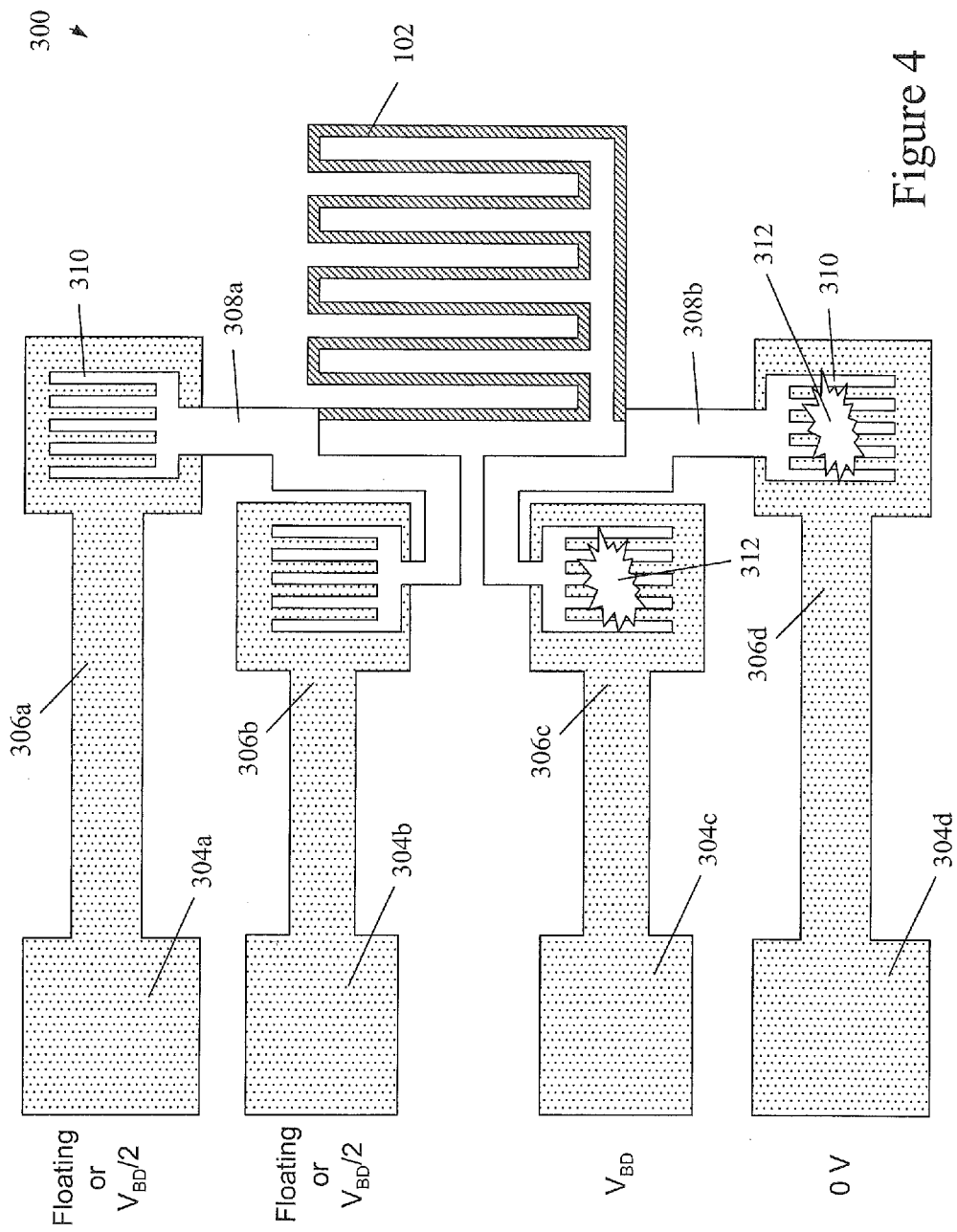
FIG. 4 illustrates a first step in activating the test structure of FIG. 3 by electrically breaking down a first set of gate dielectric regions of the test structure.

FIG. 4 illustrates a first step in activating the test structure of FIG. 3 by electrically breaking down a first set of gate dielectric regions. More specifically, the gate dielectric material beneath finger structures 310 of conductive line 308b is subjected to a relatively high voltage applied across probe pads 304c and 304d. In the exemplary embodiment shown, a breakdown voltage denoted $V_{BD}$ is applied to probe pad 304c, while probe pad 304d is held to ground potential (0V). It should be noted at this point that the breakdown voltage depicted in FIG. 4 represents the bias such that the electrical potential is high enough to breakdown two gate dielectrics in series, and thus specific values of $V_{BD}$ should not be construed in any limiting sense.

More generally, the voltage across the probe pads 304c and 304d is sufficiently high enough to cause dielectric breakdown of the oxide layer below at least one or more of the fingers of conductive line 308b, as indicated by the regions 312. Once broken, the resistance decreases such that a good conduction path exists between the RX and PC levels of the test structure. At the same time, however, it is desired to maintain the integrity of the DUT 102. During this process, the probe pads 304a and 304b are either left electrically floating or, alternatively biased to be about half $V_{BD}$ to protect the DUT 102 from abrupt voltage drop across both ends thereof as the breakdown events take place in the loop defined by probe pads 304c and 304d.

Figure 5:
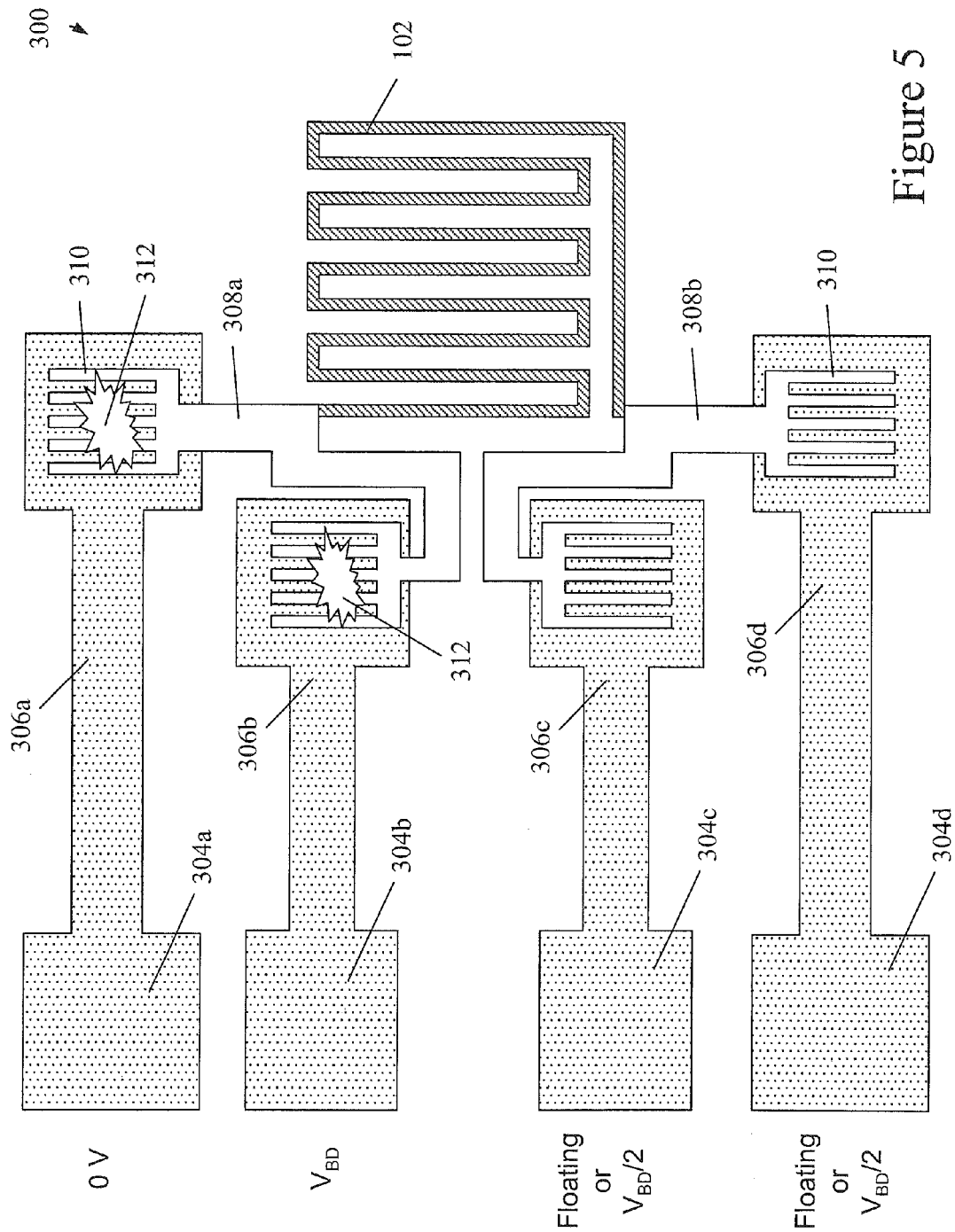
FIG. 5 illustrates a second step in activating the test structure of FIG. 4 by electrically breaking down a second set of gate dielectric regions of the test structure.

Once the dielectric breakdown of the oxide layer below at least one or more of the finger structures 310 of conductive line 308b is achieved, the same is performed for the oxide layer below one or more of the fingers 310 of conductive line 308a. As shown in FIG. 5, a second step in activating the test structure 300 by electrically breaking down a second set of gate dielectric regions is illustrated. In this instance, the gate dielectric material beneath fingers 310 of conductive line 308a is subjected to a relatively high voltage applied across probe pads 304a and 304b. In the exemplary embodiment shown, a breakdown voltage $V_{BD}$ is applied to probe pad 304a, while probe pad 304b is held to 0V. Once again, to maintain the integrity of the DUT 102, during the time that the potential of the conductive line 308a is raised to $V_{BD}$, the potential applied to probe pads 304c and 304d is either left floating or set to some intermediate level between $V_{BA}$ and 0V (e.g., $V_{BA}/2$) so that the DUT 102 does not receive the abrupt potential drop across its opposing ends. As a result, the applied voltage cause dielectric breakdown of the oxide layer below at least one or more of the fingers of conductive line 308a, as indicated by the regions 312.

Figure 6:
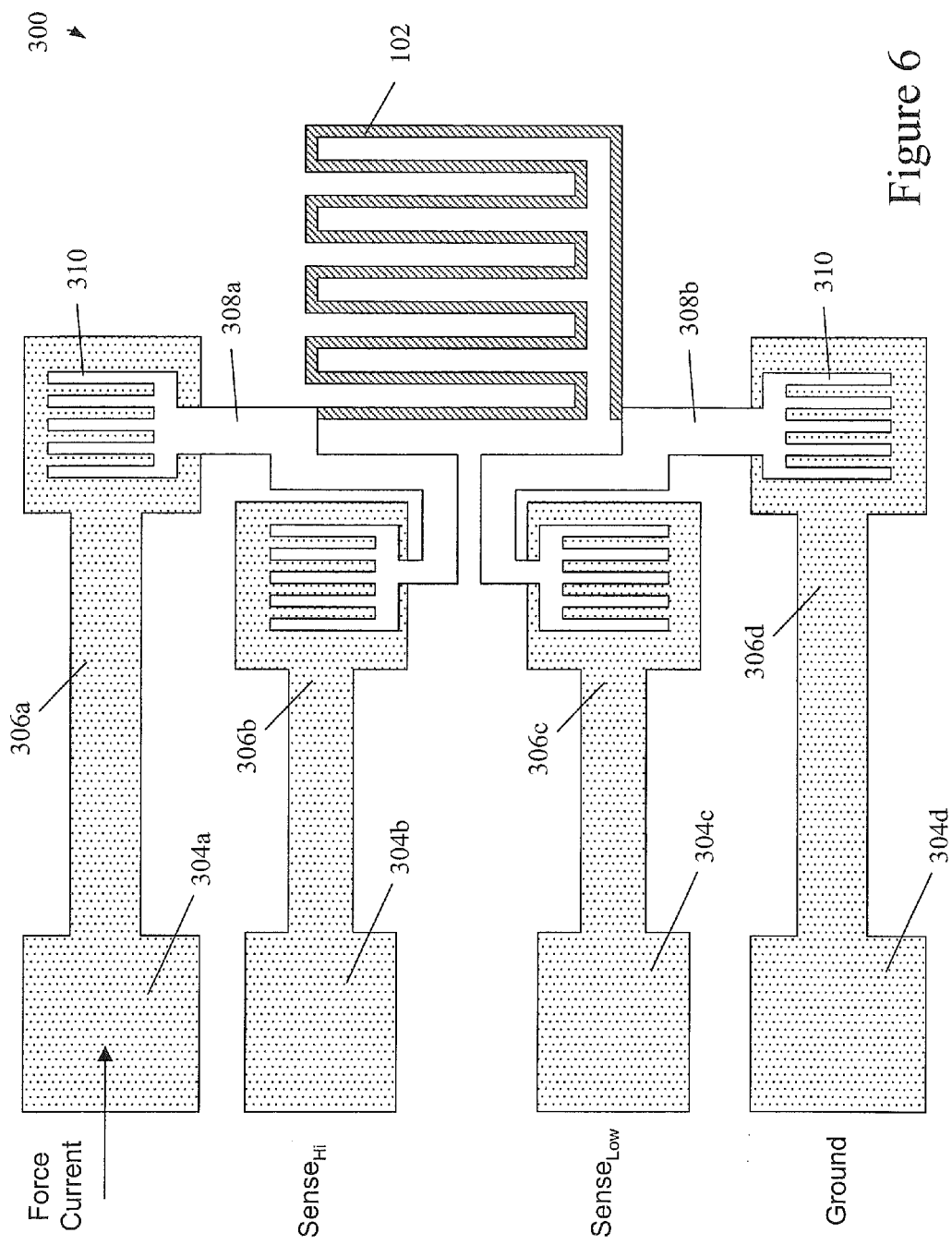
FIG. 6 illustrates an exemplary test method using the test structure of FIG. 5, in accordance with a further embodiment of the invention.

Finally, as shown in FIG. 6, with dielectric breakdown of the finger structures 310 of both conductive lines 308a and 308b completed, the test structure is ready for post-silicide, 4-point testing. By way of example, a current source is applied to RX level probe pad 304a, while the RX level probe pad 304d tied to ground. The RX level probe pads 304b and 304c are labeled as $Sense_{HI}$ and $Sense_{Low}$ for voltage drop sensing. Due to the dielectric breakdown of the oxide material between one or more of the finger structures 310 of the conductive lines 308a and 308b, a conductive path is established throughout the test structure 300 so that PS testing of the DUT may occur, even though the top surfaces of the PC level structures are covered with insulating material.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A test structure for testing transistor gate structures in an integrated circuit (IC) device, comprising:
   one or more probe pads formed at an active area of the IC device;
   one or more first conductive lines formed at the active area of the IC device, in electrical contact with the one or more probe pads;
   one or more second conductive lines formed at a gate conductor level of the IC device, in electrical contact with the one or more first conductive lines; and
   a gate electrode structure to be tested, formed at the gate conductor level and in electrical contact with the one or more second conductive lines;
   wherein the electrical contact between the one or more second conductive lines and the one or more first conductive lines is facilitated by a localized dielectric breakdown of a gate dielectric material disposed between the one or more second conductive lines and the one or more first conductive lines.

2. The test structure of claim 1, wherein a first of the one or more second conductive lines is in contact with a first end of the gate electrode structure, and a second of the one or more second conductive lines is in contact with a second end of the gate electrode structure.

3. The test structure of claim 2, wherein each of the one or more second conductive lines includes a plurality of finger structures disposed at opposing ends thereof, the finger structures configured to facilitate dielectric breakdown of the gate dielectric material therebelow.

4. The test structure of claim 1, wherein the one or more probe pads and the one or more first conductive lines comprise doped semiconductor regions having a silicide metal contact formed thereon.

5. The test structure of claim 4, wherein the one or more second conductive lines and the gate electrode structure comprise a conductive metal material.

6. A test structure for testing transistor gate structures in an integrated circuit (IC) device incorporating gate last, high-k metal gate fabrication technology, comprising:
   one or more probe pads formed at an active area of the IC device;
   one or more first conductive lines formed at the active area of the IC device, in electrical contact with the one or more probe pads;
   one or more second conductive lines formed at a gate conductor level of the IC device, in electrical contact with the one or more first conductive lines; and
   a gate electrode structure to be tested, formed at the gate conductor level and in electrical contact with the one or more second conductive lines, the one or more second conductive lines and the gate electrode structure comprising a conductive metal material;
   the electrical contact between the one or more second conductive lines and the one or more first conductive lines being facilitated by a localized dielectric breakdown of a gate dielectric material disposed between the one or more second conductive lines and the one or more first conductive lines;
   a first of the one or more second conductive lines in contact with a first end of the gate electrode structure, and a second of the one or more second conductive lines is contact with a second end of the gate electrode structure;

wherein each of the one or more second conductive lines includes a plurality of finger structures disposed at opposing ends thereof, the finger structures configured to facilitate dielectric breakdown of the gate dielectric material therebelow.

7. The test structure of claim 6, wherein the one or more probe pads and the one or more first conductive lines comprise doped semiconductor regions having a silicide metal contact formed thereon.

8. A method of forming a test structure for testing transistor gate structures in an integrated circuit (IC) device, the method comprising:
forming one or more probe pads at an active area of the IC device;
forming one or more first conductive lines at the active area of the IC device, in electrical contact with the one or more probe pads;
forming one or more second conductive lines at a gate conductor level of the IC device, in electrical contact with the one or more first conductive lines;
forming a gate electrode structure to be tested, at the gate conductor level and in electrical contact with the one or more second conductive lines; and
facilitating the electrical contact between the one or more second conductive lines and the one or more first conductive lines by locally breaking down a gate dielectric material disposed between the one or more second conductive lines and the one or more first conductive lines.

9. The method of claim 8, wherein a first of the one or more second conductive lines is in contact with a first end of the gate electrode structure, and a second of the one or more second conductive lines is in contact with a second end of the gate electrode structure.

10. The method of claim 9, wherein each of the one or more second conductive lines includes a plurality of finger structures disposed at opposing ends thereof, the finger structures configured to facilitate dielectric breakdown of the gate dielectric material therebelow.

11. The method of claim 10, wherein the locally breaking down the gate dielectric material disposed between the one or more second conductive lines and the one or more first conductive lines further comprises:
applying a first voltage across a first pair of the probe pads associated with the first of the one or more second conductive lines, the first voltage being sufficient to cause dielectric breakdown of the gate dielectric material below the finger structures of the opposing ends of the first of the one or more second conductive lines; and
performing one of: leaving the second pair of the probe pads associated with the second of the one or more second conductive lines electrically floating or applying a second voltage thereacross, the second voltage being sufficient to protect the gate dielectric material beneath gate electrode structure to be tested during application of the first voltage across the first pair of the probe pads.

12. The method of claim 11, further comprising:
following the dielectric breakdown of the gate dielectric material below the finger structures of the opposing ends of the first of the one or more second conductive lines, applying the first voltage across the second pair of the probe pads associated with the second of the one or more second conductive lines, the first voltage being sufficient to cause dielectric breakdown of the gate dielectric material below the finger structures of the opposing ends of the second of the one or more second conductive lines; and
performing one of: leaving the first pair of the probe pads associated with the first of the one or more second conductive lines electrically floating or applying the second voltage thereacross, the second voltage being sufficient to protect the gate dielectric material beneath gate electrode structure to be tested during application of the first voltage across the second pair of the probe pads.

13. The method of claim 12, wherein the second voltage is about half the first voltage.

14. The method of claim 8, wherein the one or more probe pads and the one or more first conductive lines comprise doped semiconductor regions having a silicide metal contact formed thereon.

15. The method of claim 11, wherein the one or more second conductive lines and the gate electrode structure comprise a conductive metal material.

16. A method of implementing post-silicide testing of transistor gate structures in an integrated circuit (IC) device, the method comprising:
applying a pair of test probes to exposed probe pads located at an active area of the IC device so as to complete a current path through a test structure and a gate electrode structure to be tested, with the test structure further comprising:
the exposed probe pads, one or more first conductive lines formed at the active area of the IC device, in electrical contact with the exposed probe pads;
one or more second conductive lines formed at a gate conductor level of the IC device, in electrical contact with the one or more first conductive lines, and with the gate electrode structure to be tested;
the one or more second conductive lines and the gate electrode structure to be tested being covered by an insulating material; and
wherein the electrical contact between the one or more second conductive lines and the one or more first conductive lines is facilitated by a localized dielectric breakdown of a gate dielectric material disposed between the one or more second conductive lines and the one or more first conductive lines.

17. The method of claim 16, wherein each of the one or more second conductive lines includes a plurality of finger structures disposed at opposing ends thereof, the finger structures configured to facilitate dielectric breakdown of the gate dielectric material therebelow.

18. The method of claim 17, wherein the locally breaking down the gate dielectric material disposed between the one or more second conductive lines and the one or more first conductive lines further comprises:
applying a first voltage across a first pair of the probe pads associated with the first of the one or more second conductive lines, the first voltage being sufficient to cause dielectric breakdown of the gate dielectric material below the finger structures of the opposing ends of the first of the one or more second conductive lines; and
performing one of: leaving the second pair of the probe pads associated with the second of the one or more second conductive lines electrically floating or applying a second voltage thereacross, the second voltage being sufficient to protect the gate dielectric material beneath gate electrode structure to be tested during application of the first voltage across the first pair of the probe pads.

19. The method of claim 18, further comprising:
following the dielectric breakdown of the gate dielectric material below the finger structures of the opposing ends of the first of the one or more second conductive lines, applying the first voltage across the second pair of the probe pads associated with the second of the one or more second conductive lines, the first voltage being sufficient to cause dielectric breakdown of the gate dielectric material below the finger structures of the opposing ends of the second of the one or more second conductive lines; and performing one of: leaving the first pair of the probe pads associated with the first of the one or more second conductive lines electrically floating or applying the second voltage thereacross, the second voltage being sufficient to protect the gate dielectric material beneath gate electrode structure to be tested during application of the first voltage across the second pair of the probe pads.

20. The method of claim 19, wherein the second voltage is about half the first voltage.

* * * * *